(12) United States Patent
Nakazumi et al.

(10) Patent No.: US 10,689,496 B2
(45) Date of Patent: Jun. 23, 2020

(54) RESIN COMPOSITION, PREPREG, METAL FOIL-CLAD LAMINATE, RESIN SHEET AND PRINTED CIRCUIT BOARD

(71) Applicant: MITSUBISHI GAS CHEMICAL COMPANY, INC., Tokyo (JP)

(72) Inventors: Yoshihiro Nakazumi, Tokyo (JP); Daisuke Ueyama, Niigata (JP); Kentaro Takano, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days.

(21) Appl. No.: 16/063,429

(22) PCT Filed: Aug. 23, 2017

(86) PCT No.: PCT/JP2017/030202
§ 371 (c)(1),
(2) Date: Jun. 18, 2018

(87) PCT Pub. No.: WO2018/038179
PCT Pub. Date: Mar. 1, 2018

(65) Prior Publication Data
US 2019/0153177 A1    May 23, 2019

(30) Foreign Application Priority Data
Aug. 24, 2016  (JP) .................. 2016-163749

(51) Int. Cl.
*C08J 5/24*     (2006.01)
*B32B 15/08*    (2006.01)
(Continued)

(52) U.S. Cl.
CPC ................ *C08J 5/24* (2013.01); *B32B 15/08* (2013.01); *B32B 15/088* (2013.01);
(Continued)

(58) Field of Classification Search
CPC ...... C08K 2003/385; C08J 5/24; B32B 15/08; B32B 15/088; C08L 35/00; C08L 79/00; C08G 18/3846; C08G 18/7664
See application file for complete search history.

(56) References Cited

U.S. PATENT DOCUMENTS

2006/0121068 A1   6/2006   Sane et al.
2006/0127422 A1   6/2006   Lodyga et al.
(Continued)

FOREIGN PATENT DOCUMENTS

CN   103249695 A   8/2013
CN   103917596 A   7/2014
(Continued)

OTHER PUBLICATIONS

International Search Report Patent Application No. PCT/JP2017/030202, dated Nov. 21, 2017.

*Primary Examiner* — Monique R Jackson
(74) *Attorney, Agent, or Firm* — Greenblum & Bernstein, P.L.C.

(57) ABSTRACT

The resin composition according to the present invention is a resin composition including a cyanate compound (A) and/or a maleimide compound (B), and an inorganic filler (C), wherein the inorganic filler (C) includes a boron nitride particle aggregate including primary hexagonal boron nitride particles, wherein (0001) planes of the primary hexagonal boron nitride particles are stacked on top of each other to thereby form the boron nitride particle aggregate.

12 Claims, 4 Drawing Sheets

(a) Primary hexagonal boron nitride particle

←―― (0001) plane (b)   Boron nitride particle aggregate

Example satisfying 0.3r < R       Example satisfying r < R

(51) Int. Cl.

| | |
|---|---|
| *C08K 3/38* | (2006.01) |
| *H05K 1/03* | (2006.01) |
| *C01B 21/064* | (2006.01) |
| *C08G 18/38* | (2006.01) |
| *C08G 18/76* | (2006.01) |
| *C08L 35/00* | (2006.01) |
| *C08F 22/40* | (2006.01) |
| *C08L 79/00* | (2006.01) |
| *C08G 73/00* | (2006.01) |
| *B32B 15/088* | (2006.01) |
| *H05K 1/02* | (2006.01) |

(52) U.S. Cl.
CPC ........ *C01B 21/064* (2013.01); *C01B 21/0648* (2013.01); *C08F 22/40* (2013.01); *C08G 18/3846* (2013.01); *C08G 18/7664* (2013.01); *C08G 73/00* (2013.01); *C08K 3/38* (2013.01); *C08L 35/00* (2013.01); *C08L 79/00* (2013.01); *H05K 1/03* (2013.01); *H05K 1/0373* (2013.01); *B32B 2457/08* (2013.01); *C01P 2004/03* (2013.01); *C01P 2004/30* (2013.01); *C01P 2004/50* (2013.01); *C08J 2375/12* (2013.01); *C08K 2003/385* (2013.01); *C08K 2201/001* (2013.01); *H05K 1/0204* (2013.01); *H05K 2201/0209* (2013.01); *H05K 2201/0248* (2013.01)

(56) References Cited

U.S. PATENT DOCUMENTS

| | | |
|---|---|---|
| 2007/0041918 A1 | 2/2007 | Meneghetti et al. |
| 2007/0241303 A1 | 10/2007 | Zhong et al. |
| 2012/0114905 A1 | 5/2012 | Engler et al. |
| 2013/0157061 A1 | 6/2013 | Sogame et al. |
| 2013/0337269 A1 | 12/2013 | Ohtsuka et al. |
| 2014/0349089 A1 | 11/2014 | Ueyama et al. |
| 2014/0349105 A1 | 11/2014 | Yamazaki et al. |
| 2016/0009947 A1 | 1/2016 | Kawase et al. |
| 2016/0326063 A1 | 11/2016 | Engler et al. |
| 2016/0353570 A1* | 12/2016 | Lee .................. H05K 1/0373 |
| 2017/0081579 A1 | 3/2017 | Fujikawa et al. |

FOREIGN PATENT DOCUMENTS

| | | |
|---|---|---|
| EP | 2578631 | 4/2013 |
| EP | 2684904 | 1/2014 |
| JP | 2008-510878 A | 4/2008 |
| JP | 2013-543834 A | 12/2013 |
| JP | 2014-208818 A | 11/2014 |
| JP | 2015-006985 A | 1/2015 |
| JP | 2015-209529 A | 11/2015 |
| JP | 2016-113592 A | 6/2016 |
| KR | 10-2013-0105682 A | 9/2013 |
| KR | 10-2014-0090991 A | 7/2014 |
| WO | 2011/152402 A | 12/2011 |
| WO | 2012/121224 A | 9/2012 |
| WO | 2013/069479 A | 5/2013 |
| WO | 2013/081061 A | 6/2013 |

\* cited by examiner (a) Primary hexagonal boron nitride particle (0001) plane (b) Boron nitride particle aggregate Example satisfying 0.3r < R      Example satisfying r < R

RESIN COMPOSITION, PREPREG, METAL FOIL-CLAD LAMINATE, RESIN SHEET AND PRINTED CIRCUIT BOARD

TECHNICAL FIELD

The present invention relates to a resin composition, a prepreg, a metal foil-clad laminate, a resin sheet and a printed circuit board.

BACKGROUND ART

The internal heat density of electronic equipment has kept increasing year by year with recent increase in the speed or integration of circuits of electric or electronic equipment, and increase in the packaging density of heat-generating electronic components in printed circuit boards. Therefore, there is a demand for members having high thermal conductivity and electrical insulating properties and efficiently dissipating heat generated in electronic components and the like.

Thermosetting resins, such as epoxy resins, for use in the insulating layers of printed circuit boards, have low thermal conductivity in themselves. Accordingly, a method of adding to a thermosetting resin larger amount of an inorganic filler excellent in thermal conductivity is known in order to improve thermal conductivity as printed circuit boards. However, the addition of the larger amount of the inorganic filler to the thermosetting resin composition deteriorates moldability due to the decreased volume ratio of the thermosetting resin and is more likely to cause cracks or voids between the resin and the inorganic filler. Therefore, there are problems of deteriorated heat resistant properties upon moisture absorption, decreased elastic modulus, and reduced copper foil peel strength due to insufficient close contact between the resin and the inorganic filler. In light of such problems, use of various resin compositions has been proposed.

For example, Patent Literature 1 discloses a resin composition comprising a naphthol aralkyl-based cyanic acid ester resin and an epoxy resin, and discloses that the resin composition supplemented with a specific amount of an inorganic filler exerts excellent heat resistance, thermal conductivity and water absorbability.

Patent Literature 2 discloses a resin composition comprising a cyanate compound and an epoxy resin, and discloses that the resin composition supplemented with two types of inorganic fillers differing in particle size has favorable moldability and exerts high heat dissipating properties, a high glass transition temperature, copper foil peel strength, and heat resistance upon moisture absorption.

Patent Literature 3 discloses a resin composition comprising an epoxy resin and a curing agent, and discloses that the resin composition supplemented with borate particles coated with hexagonal boron nitride as an inorganic filler exerts a high glass transition temperature, copper foil peel strength, heat resistance upon moisture absorption, flame retardancy, a low coefficient of thermal expansion and high heat dissipating properties.

CITATION LIST

Patent Literature

Patent Literature 1: International Publication No. WO 2011/152402

Patent Literature 2: International Publication No. WO 2013/069479

Patent Literature 3: International Publication No. WO 2012/121224

SUMMARY OF INVENTION

Technical Problem

The resin compositions disclosed in Patent Literatures 1 to 3 improve physical properties such as thermal conductivity or copper foil peel strength to some extent. These physical properties, however, are still susceptible to improvement.

The present invention has been made in light of the problems described above, and an object of the present invention is to provide a resin composition capable of exerting excellent thermal conductivity and copper foil peel strength, a prepreg, a metal foil-clad laminate, a resin sheet and a printed circuit board.

Solution to Problem

The present inventors have conducted diligent studies to attain the object. As a result, the present inventors have completed the present invention by finding that the object can be attained by adding, as an inorganic filler, a boron nitride particle aggregate to a resin composition comprising a cyanate compound and/or a maleimide compound, wherein (0001) planes of primary boron nitride particles are stacked on top of each other to thereby aggregate.

Specifically, the present invention encompasses the following aspects:

[1]

A resin composition comprising a cyanate compound (A) and/or a maleimide compound (B), and an inorganic filler (C), wherein the inorganic filler (C) comprises a boron nitride particle aggregate comprising primary hexagonal boron nitride particles, wherein (0001) planes of the primary hexagonal boron nitride particles are stacked on top of each other to thereby form the boron nitride particle aggregate.

[2]

The resin composition according to [1], wherein the boron nitride particle aggregate has a pillar shape.

[3]

The resin composition according to [1] or [2], wherein a longest diameter in a layering direction of the boron nitride particle aggregate is larger than a longest diameter in a width direction of the boron nitride particle aggregate.

[4]

The resin composition according to any of [1] to [3], wherein the primary hexagonal boron nitride particles have a component derived from a coupling agent.

[5]

The resin composition according to any of [1] to [4], wherein a content of the inorganic filler (C) is 1 to 1600 parts by mass based on 100 parts by mass of a resin solid component.

[6]

The resin composition according to any of [1] to [5], wherein the cyanate compound (A) comprises at least one of a cyanate compound represented by the following general formula (1) and a cyanate compound represented by the formula (2):

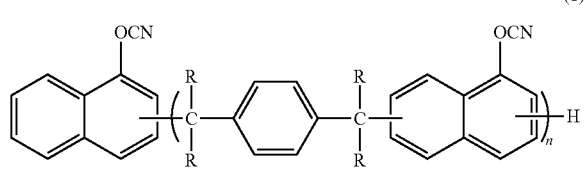

(1)

wherein R represents a hydrogen atom or a methyl group, and n represents an integer of 1 or larger, and

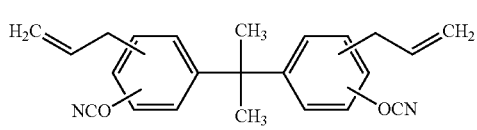

(2)

[7]

The resin composition according to any of [1] to [6], wherein a content of the cyanate compound (A) is 1 to 90 parts by mass based on 100 parts by mass of a resin solid component.

[8]

The resin composition according to any of [1] to [7], wherein the maleimide compound (B) comprises at least one compound selected from the group consisting of bis(4-maleimidophenyl)methane, 2,2-bis{4-(4-maleimidophenoxy)-phenyl}propane, bis(3-ethyl-5-methyl-4-maleimidophenyl)methane, and a maleimide compound represented by the following general formula (3):

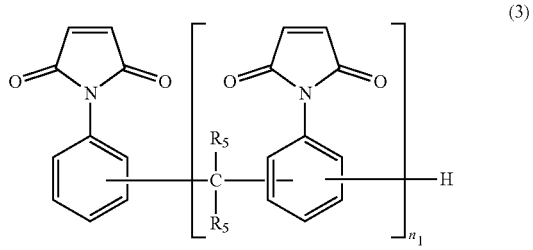

(3)

wherein each $R_5$ independently represents a hydrogen atom or a methyl group, and $n_1$ represents an integer of 1 or larger.

[8]

The resin composition according to any of [1] to [8], wherein a content of the maleimide compound (B) is 1 to 90 parts by mass based on 100 parts by mass of a resin solid component.

[10]

The resin composition according to any of [6] to [9], further comprising one or more selected from the group consisting of: a cyanate compound other than the cyanate compound (A) represented by the formula (1) and the cyanate compound (A) represented by the formula (2); an epoxy resin; an oxetane resin; a phenol resin; a benzoxazine compound; and a compound having a polymerizable unsaturated group.

[11]

A prepreg comprising a base material (D), and the resin composition according to any of [1] to [10], with which the base material (D) is impregnated or coated.

[12]

A metal foil-clad laminate comprising the prepreg according to [11], and a metal foil disposed on one side or both sides of the prepreg, wherein the metal foil-clad laminate comprises a cured product of the resin composition contained in the prepreg.

[13]

A resin sheet comprising the resin composition according to any of [1] to [10].

[14]

A printed circuit board comprising an insulating layer, and a conductor layer formed on a surface of the insulating layer, wherein the insulating layer comprises the resin composition according to any of [1] to [10].

Advantageous Effects of Invention

The present invention can provide a resin composition capable of exerting excellent thermal conductivity and copper foil peel strength, a prepreg, a metal foil-clad laminate, a resin sheet and a printed circuit board.

DESCRIPTION OF EMBODIMENTS

Figure 1:
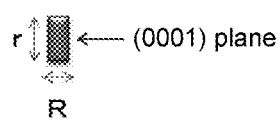
FIG. 1 shows a diagram illustrating R and r according to the present embodiment.
Figure 1:
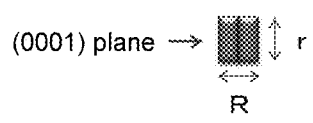
Figure 1:

Hereinafter the embodiment for carrying out the present invention (hereinafter, referred to as the "present embodiment") will be described in detail. However, the present invention is not intended to be limited by this embodiment, and various changes or modifications can be made therein without departing from the spirit of the present invention.

The resin composition of the present embodiment is a resin composition comprising a cyanate compound (A) and/or a maleimide compound (B), and an inorganic filler (C), wherein the inorganic filler (C) comprises a boron nitride particle aggregate comprising primary hexagonal boron nitride particles, wherein (0001) planes of the primary hexagonal boron nitride particles are stacked on top of each other to thereby form the boron nitride particle aggregate. The resin composition of the present embodiment thus configured can exert excellent thermal conductivity and copper foil peel strength. Hereinafter, each component constituting the resin composition of the present embodiment will be described.

[Cyanate Compound (A)]

In the resin composition of the present embodiment, the cyanate compound (A) is an optional component and may not be contained. The resin composition of the present embodiment preferably comprises the cyanate compound (A) from the viewpoint of desmear resistance and high elastic modulus under heat. Examples of the type of the cyanate compound (A) include, but are not particularly limited to, a novolac-based cyanic acid ester represented by the general formula (A) given below, a cyanate compound represented by the general formula (1) given below (naphthol aralkyl-based cyanic acid ester), a cyanate compound represented by the formula (2) (diallyl bisphenol A-based cyanate), biphenyl aralkyl-based cyanic acid ester, bis(3,3-dimethyl-4-cyanatophenyl)methane, bis(4-cyanatophenyl)methane, 1,3-dicyanatobenzene, 1,4-dicyanatobenzene, 1,3,5-tricyanatobenzene, 1,3-dicyanatonaphthalene, 1,4-dicyanatonaphthalene, 1,6-dicyanatonaphthalene, 1,8-dicyanatonaphthalene, 2,6-dicyanatonaphthalene, 2,7'-dicyanatonaphthalene, 1,3,6-tricyanatonaphthalene, 4,4'-dicyanatobiphenyl, bis(4-cyanatophenyl)ether, bis(4-cyanatophenyl)thioether, bis(4-cyanatophenyl)sulfone, and 2,2-bis(4-cyanatophenyl)propane. These cyanate compounds (A) may each be used alone or may be used in combination of two or more thereof. In the present embodiment, the cyanate compound (A) preferably comprises at least one of a cyanate compound represented by the general formula (1) and a cyanate compound represented by the formula (2).

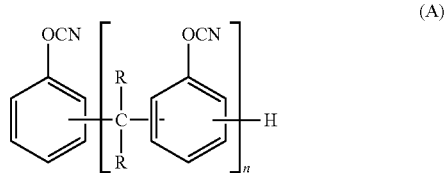

In the general formula (A), R represents a hydrogen atom or a methyl group, and n represents an integer of 1 or larger. R described above is preferably a hydrogen atom. n described above is preferably an integer of 10 or smaller, more preferably an integer of 7 or smaller.

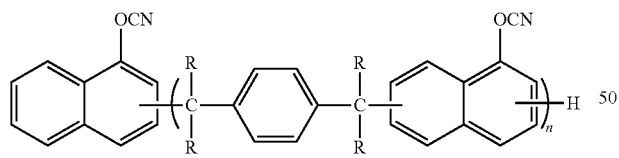

In the general formula (1), R represents a hydrogen atom or a methyl group, and n represents an integer of 1 or larger. R described above is preferably a hydrogen atom. n described above is preferably an integer of 10 or smaller, more preferably an integer of 6 or smaller.

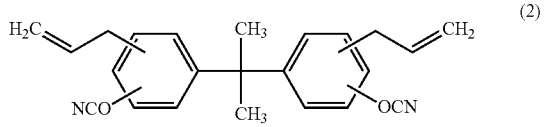

In the resin composition of the present embodiment, the content of the cyanate compound (A) is preferably 1 to 90 parts by mass, more preferably 5 to 85 parts by mass, further preferably 10 to 80 parts by mass, based on 100 parts by mass of a resin solid component. The content of the cyanate compound falls within the range described above, whereby the resulting resin composition can maintain excellent moldability even when packed with an inorganic filler, while curability, elastic modulus under heat, desmear resistance, etc. tend to be further improved.

In the present specification, the term "resin solid component" refers to components except for a solvent and the inorganic filler (C) in the resin composition, unless otherwise specified. The term "100 parts by mass of a resin solid component" means that the total of components except for a solvent and the inorganic filler (C) in the resin composition is 100 parts by mass.

[Maleimide Compound (B)]

In the resin composition of the present embodiment, the maleimide compound (B) is an optional component and may not be contained. The resin composition of the present embodiment preferably comprises the maleimide compound (B) from the viewpoint of heat resistance. The maleimide compound is not particularly limited as long as the compound has one or more maleimide groups in the molecule. Preferred examples thereof include N-phenylmaleimide, N-hydroxyphenylmaleimide, bis(4-maleimidophenyl)methane, 2,2-bis{4-(4-maleimidophenoxy)-phenyl}propane, bis(3,5-dimethyl-4-maleimidophenyl)methane, bis(3-ethyl-5-methyl-4-maleimidophenyl)methane, bis(3,5-diethyl-4-maleimidophenyl)methane, polytetramethylene oxide-bis(4-maleimidobenzoate), a maleimide compound represented by the general formula (3) given below, prepolymers of these maleimide compounds, and prepolymers of these maleimide compounds and amine compounds. These maleimide compounds may each be used alone or may be used in combination of two or more thereof. In the present embodiment, the maleimide compound (B) preferably comprises at least one compound selected from the group consisting of bis(4-maleimidophenyl)methane, 2,2-bis{4-(4-maleimidophenoxy)-phenyl}propane, bis(3-ethyl-5-methyl-4-maleimidophenyl)methane, and a maleimide compound represented by the formula (3) given below. In this case, there is a tendency to further decrease the coefficient of thermal expansion of the resulting cured product and to further improve heat resistance and a glass transition temperature.

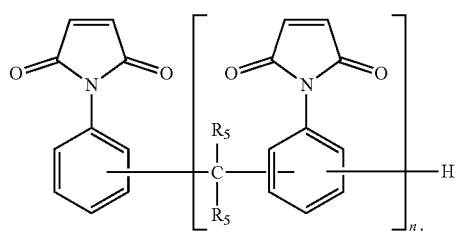

In the general formula (3), each $R_5$ independently represents a hydrogen atom or a methyl group, and $n_1$ represents an integer of 1 or larger.

In the general formula (3), $R_5$ preferably represents a hydrogen atom. $n_1$ is preferably 10 or smaller, more preferably 7 or smaller.

The content of the maleimide compound (B) is preferably 1 to 90 parts by mass, more preferably 5 to 85 parts by mass, further preferably 10 to 80 parts by mass, based on 100 parts by mass of a resin solid component. The content of the maleimide compound (B) falls within the range described above, whereby there is a tendency to further decrease the coefficient of thermal expansion of the resulting cured product and to further improve heat resistance.

The resin composition of the present embodiment comprises at least one of the cyanate compound (A) and the maleimide compound (B) and preferably comprises both of the cyanate compound (A) and the maleimide compound (B) from the viewpoint of heat resistance, burn resistance, mechanical physical properties, long-term heat resistance, chemical resistance and electrical insulating properties.

[Inorganic Filler (C)]

The inorganic filler (C) comprises a boron nitride particle aggregate comprising primary hexagonal boron nitride particles. This boron nitride particle aggregate is formed such that (0001) planes of the primary hexagonal boron nitride particles are stacked on top of each other. Examples of the method for confirming that the boron nitride particle aggregate is contained in the resin composition of the present embodiment and has a preferred shape mentioned later include a method described in Examples mentioned later. Specifically, these can be easily confirmed by observing the resin composition of the present embodiment under SEM. The configuration of the boron nitride particle aggregate before preparation into the resin composition can also be confirmed in the same way as above. It can be said, from the viewpoint mentioned later, that the boron nitride particle aggregate according to the present embodiment tends to maintain a layered structure in which (0001) planes of the primary hexagonal boron nitride particles are stacked on top of each other, i.e., tends to maintain the structure at each stage such as the stage of preparing a resin composition or the stage of molding the resin composition. In short, provided that the boron nitride particle aggregate as a raw material of the inorganic filler (C) can be confirmed to satisfy the desired configuration of the present embodiment, the resin composition of the present embodiment can be regarded as comprising the boron nitride particle aggregate.

(Boron Nitride Particle Aggregate)

Examples of the particle shape of the primary hexagonal boron nitride particles constituting the boron nitride particle aggregate according to the present embodiment include, but are not particularly limited to, scale-like, flat, granular, spherical, fibrous, and whisker-like shapes. Among them, a scale-like shape is preferred.

The average particle size of the primary hexagonal boron nitride particles is not particularly limited and is preferably 0.1 to 50 µm, more preferably 0.1 to 5 µm, particularly preferably 0.1 to 1 µm, in terms of median size. The average particle size falls within the range described above, whereby the primary hexagonal boron nitride particles easily aggregate such that their (0001) planes are stacked on top of each other. As a result, the thermal conductivity of a resin sheet tends to be improved.

In this context, the average particle size of the primary hexagonal boron nitride particles can be measured by, for example, a wet laser diffraction/scattering method.

Examples of the aggregation form of the boron nitride particle aggregate formed by the aggregation, wherein (0001) planes of the primary hexagonal boron nitride particles are stacked on top of each other, include, but are not particularly limited to, spontaneous aggregation, aggregation using an aggregating agent, and physical aggregation. Examples of the spontaneous aggregation include, but are not limited to, aggregation ascribable to van der Waals' force, electrostatic force, adsorbed moisture, or the like. Examples of the aggregation using an aggregating agent include, but are not limited to, aggregation using an aggregating agent such as a coupling agent, an inorganic salt, or a polymer substance. In the case of using, for example, a coupling agent as the aggregating agent, it is preferred for aggregation that the surface condition of the primary hexagonal boron nitride particles should be changed to a condition with high surface energy, i.e., a condition facilitating aggregation. Examples of the physical aggregation include aggregation methods by operation such as mixing granulation, extrusion granulation, or spray drying. Among them, aggregation using a coupling agent is preferred from the viewpoint of aggregation force.

In the present specification, the "boron nitride particle aggregate" is a collective unit of secondary particles formed by the aggregation of the filler comprising the primary hexagonal boron nitride particles and can take various shapes. Specifically, the shape of the boron nitride particle aggregate is not particularly limited as long as (0001) planes of the primary hexagonal boron nitride particles are stacked on top of each other to thereby aggregate. For example, any of pillar, flat, granular, block, spherical, and fibrous shapes may be used.

In the present embodiment, the boron nitride particle aggregate having a pillar shape is preferred because there is a tendency to increase the possibility that the a-axis direction of the primary hexagonal boron nitride particles in a prepared resin sheet agrees with the thickness direction of the resin sheet (hereinafter, this possibility is also simply referred to as "orientation"). In the present specification, the "pillar shape" refers to a shape derived from the aggregation form of the primary hexagonal boron nitride particles. The pillar shape means a shape including a prismatic, cylindrical, and rod-like shapes, etc., and differs from a spherical shape. The pillar shape further includes a shape extending straight in the vertical direction, a shape extending in an inclined pattern, a shape extending while curved, a shape extending in a branched pattern, etc. The pillar shape of the boron nitride particle aggregate can be easily confirmed by scanning electron microscope (SEM) observation.

Typical examples of the method for confirming that the boron nitride particle aggregate according to the present embodiment has a pillar shape include, but are not limited to, a method which involves identifying longest diameter R in the layering direction of the boron nitride particle aggregate and longest diameter r in the width direction of the boron nitride particle aggregate by SEM observation, and confirming the magnitude relationship therebetween. In the present embodiment, the boron nitride particle aggregate preferably satisfies R>0.3r from the viewpoint of further increasing the orientation. In the present embodiment, the boron nitride particle aggregate more preferably satisfies R>r from the viewpoint of still further increasing the orientation. In this context, the "layering direction" is specifically a direction substantially parallel to the c-axis direction of the primary hexagonal boron nitride particles. The "width direction" is specifically a direction substantially perpendicular to the layering direction. In other words, the width direction is a direction substantially parallel to the surface direction (a-axis direction) of the (0001) plane of at least one primary hexagonal boron nitride particle. In the present embodiment, the longest diameter in the width direction tends to well agree with the longest diameter in the surface direction of the (0001) plane of the primary hexagonal boron nitride particle, for example, when the boron nitride particle aggregate has a pillar shape extending straight in the vertical direction. The longest diameter in the width direction is not limited to such a relationship and may take a larger value than the longest diameter in the surface direction of the (0001) plane of the primary hexagonal boron nitride particle. In this context, the term "substantially parallel" refers to a state of within ±10° from the parallel direction, and the term "substantially perpendicular" refers to a state of within ±10° from the perpendicular direction.

R and r will be specifically described with reference to FIG. 1. A primary hexagonal boron nitride particle illustrated in FIG. 1(a) is two-dimensionally indicated as a rectangle as a typical example thereof. The long side (r) corresponds to a (0001) plane, and the short side (R) correspond to an end face. A boron nitride particle aggregate illustrated in FIG. 1(b) is formed by the aggregation of primary hexagonal boron nitride particles having a rectangular shape such that their long sides, i.e., (0001) planes are stacked on top of each other. The short side of this aggregate corresponds to r (i.e., the longest diameter in the width direction of the boron nitride particle aggregate), and the long side thereof corresponds to R (i.e., the longest diameter in the layering direction of the boron nitride particle aggregate).

The boron nitride particle aggregate according to the present embodiment has a structure where the primary hexagonal boron nitride particles are layered, as mentioned above. The layered structure is not particularly limited, and the number of primary hexagonal boron nitride particles per layer is preferably 2 or less, more preferably 1. The boron nitride particle aggregate having such a layered structure is preferred because there is a tendency to increase the orientation.

As described above, the longest diameter in the layering direction of the boron nitride particle aggregate is not particularly limited. Likewise, the longest diameter in the width direction of the boron nitride particle aggregate is not particularly limited. In the present embodiment, when the average particle size of the primary hexagonal boron nitride particles is defined as A (μm), it is preferred that R=0.3×A to 10×A (μm) and r=0.3×A to 3×A (μm) should be satisfied. Specifically, for example, primary hexagonal boron nitride particles having an average particle size of 0.5 μm typically take a value on the order of R=0.15 to 5 μm and typically take a value on the order of r=0.15 to 1.5 μm. Specific examples of the method for measuring the longest diameters described above include, but are not limited to, a method involving approximating the shape of the photographed boron nitride particle aggregate having a pillar shape in a SEM image to a rectangle and measuring the long side and the short side of the rectangle.

In the present embodiment, the state of the "(0001) planes of the primary hexagonal boron nitride particles are stacked on top of each other" is not limited to a form in which the (0001) planes are completely stacked on top of each other, and also encompasses a form in which the (0001) planes are stacked on top of each other such that the (0001) planes are displaced in the width direction.

The longest diameter r in the width direction of the boron nitride particle aggregate tends to depend on the particle size, the degree of aggregation, etc. of the primary hexagonal boron nitride particles. The longest diameter r is not particularly limited and is preferably smaller than thickness T (r<T) of a molded product such as a resin sheet, more preferably r<0.9×T, further preferably r<0.5×T. When the range described above is satisfied, reduction in smoothness caused by the rough surface of a molded product tends to be able to be prevented. It is preferred that r should be sufficiently smaller than T, from the viewpoint that the resulting resin composition can be used as a raw material of a thinner resin sheet.

The boron nitride particle aggregate according to the present embodiment may comprise a filler other than the primary hexagonal boron nitride particles. Examples of such a filler include, but are not limited to: metals and alloys including metal oxides, metal nitrides, metal carbides, and metal hydroxides such as aluminum nitride, aluminum oxide, zinc oxide, silicon carbide, and aluminum hydroxide; and spherical, powdery, fibrous, needle-like, scale-like, and whisker-like fillers made of carbon, graphite, or diamond. These fillers may each be contained alone, or plural types thereof may be contained therein.

The boron nitride particle aggregate according to the present embodiment may comprise a binder from the viewpoint of enhancing the robustness of the boron nitride particle aggregate. In this context, the "robustness" is a property indicating the strength of bonding when the primary hexagonal boron nitride particles according to the present embodiment are bonded to each other. The binder originally acts to firmly associate primary particles and stabilize the shape of the aggregate.

Such a binder is preferably a metal oxide. Specifically, aluminum oxide, magnesium oxide, yttrium oxide, calcium oxide, silicon oxide, boron oxide, cerium oxide, zirconium oxide, titanium oxide, or the like is preferably used. Among them, aluminum oxide or yttrium oxide is preferred from the viewpoint of thermal conductivity and heat resistance as an oxide, bonding force to bond the primary hexagonal boron nitride particles, etc. The binder may be a liquid binder such as alumina sol, or an organometal compound which is converted to a metal oxide by calcination may be used. These binders may each be used alone or may be used as a mixture of two or more thereof.

(Method for Producing Boron Nitride Particle Aggregate)

The method for producing the boron nitride particle aggregate according to the present embodiment is not particularly limited as long as the configuration mentioned above is obtained. Preferably, the boron nitride particle aggregate is produced by the following method: a preferred method for producing the boron nitride particle aggregate according to the present embodiment comprises: step (A) of adding a coupling agent to primary hexagonal boron nitride particles; and step (B) of dispersing the coupling agent-added primary hexagonal boron nitride particles obtained by the step (A) in a solvent. More preferably, the production method further comprises step (C) of separating the boron nitride particle aggregate from the dispersion obtained by the step (B).

When the production method comprises the step (A) and the step (B), the coupling agent-added primary hexagonal boron nitride particles tend to aggregate at their (0001) planes through surface charge in the dispersion to form a bonded phase with the coupling agent. Such a production method is preferred because the boron nitride particle aggregate having the desired configuration of the present embodiment is easily obtained. As described above, in the present embodiment, the primary hexagonal boron nitride particles preferably have a component derived from the coupling agent.

In the step (A) according to the present embodiment, the method for adding a coupling agent to primary hexagonal boron nitride particles is not particularly limited and is preferably a dry process of uniformly dispersing an undiluted solution of the coupling agent in the filler with high-speed stirring using a stirrer, followed by treatment, a wet process of dipping the filler in a dilute solution of the coupling agent, followed by stirring, or the like.

At the stage of the step (A), the coupling agent-added primary hexagonal boron nitride particles may be bonded to each other to prepare a boron nitride particle aggregate. The stirring temperature is not particularly limited, and special temperature control such as heating or cooling is unnecessary. Usually, the temperature is elevated by stirring, but is preferably 200° C. or lower. The stirring speed is not particularly limited, and the stirring is usually carried out at preferably 10 to 10000 rpm, more preferably 100 to 3000 rpm. The stirring time is preferably 5 minutes to 180 minutes and is more preferably 10 minutes to 60 minutes from the viewpoint of an effective stirring time and productivity.

The coupling agent mentioned above preferably has any one or more groups selected from the group consisting of an aryl group, an amino group, an epoxy group, a cyanate group, a mercapto group and halogen from the viewpoint of aggregation force and robustness. Examples of such a coupling agent include, but are not limited to, silane-based, titanate-based, zirconate-based, zirconium aluminate-based, and aluminate-based coupling agents. Among them, a silane-based coupling agent (hereinafter, also referred to as a "silane coupling agent") is preferred from the viewpoint of aggregation force.

The silane coupling agent mentioned above preferably has any one or more groups selected from the group consisting of an aryl group, an amino group, an epoxy group, a cyanate group, a mercapto group and halogen. Among them, the silane coupling agent more preferably has an aryl group because the resulting silane coupling agent has a π-π bond and has a stronger bond between silane coupling agents. Examples of such a coupling agent include, but are not limited to, phenyltrimethoxysilane, phenyl triethoxysilane, N-phenyl-3-aminopropyltrimethoxysilane, p-styryltrimethoxysilane, naphthyltrimethoxysilane, naphthyltriethoxysilane, (trimethoxysilyl)anthracene, and (triethoxysilyl)anthracene.

It is also preferred to use a silane coupling agent having a cross-linked structure as the coupling agent mentioned above. Specific examples of such a silane coupling agent include, but are not limited to, 1,6-bis(trimethoxysilyl)hexane, tris-(trimethoxysilylpropyl)isocyanurate, bis(triethoxysilylpropyl)tetrasulfide, and hexamethyldisilazane.

The silane coupling agent having a cross-linked structure mentioned above is also obtained by cross-linking organic functional groups through reaction. In this case, examples of the combination of the organic functional groups include, but are not limited to, combinations of organic functional groups for the coupling agent, such as an amino group-an epoxy group, an epoxy group-a cyanate group, an amino group-a cyanate group, an amino group-a sulfonic acid group, an amino group-halogen, and a mercapto group-a cyanate group.

These various coupling agents may each be used alone or may be used in combination of two or more thereof.

The amount of the coupling agent added in the step (A) depends on the surface area of the filler, i.e., the surface area of the primary hexagonal boron nitride particles. The coupling agent is preferably added at 0.01 to 10% by mass, more preferably 1 to 2% by mass, based on the primary hexagonal boron nitride particles.

The stirring method that can be used in adding the coupling agent in the production method described above is not particularly limited, and the stirring can be carried out using a general stirrer, for example, a vibrating mill, a bead mill, a ball mill, a Henschel mixer, a drum mixer, a vibrating stirrer, or a V-shaped mixer.

In the step (B) in the present embodiment, the coupling agent-added primary hexagonal boron nitride particles obtained by the step (A) are dispersed in a solvent. The method for dispersing the coupling agent-added primary hexagonal boron nitride particles in a solvent is not particularly limited. The primary hexagonal boron nitride particles with the added coupling agent having an aromatic skeleton tend to easily aggregate at their (0001) planes. Therefore, ultrasonic dispersion in a solvent is preferred.

The solvent for use in the step (B) is not particularly limited, and water and/or any of various organic solvents can be used. In the case of using the primary hexagonal boron nitride particles with the added coupling agent having an aromatic ring skeleton, i.e., an aryl group, a highly polar solvent is preferred.

The amount of the solvent used is 0.5 to 20 times the mass of the primary hexagonal boron nitride particles from the viewpoint of reducing load upon separation in the step (C), and from the viewpoint of uniform dispersion in the step (B).

In the step (B), any of various surfactants may be added from the viewpoint of adjusting the degree of aggregation of the boron nitride particle aggregate. The surfactant is not particularly limited, and, for example, an anionic surfactant, a cationic surfactant, or a nonionic surfactant can be used. These surfactants may each be used alone or may be used as a mixture of two or more thereof. The surfactant concentration in the dispersion obtained by the step (B) is not particularly limited. The surfactant concentration can usually be 0.1% by mass or higher and 10% by mass or lower and is preferably 0.5% by mass or higher and 5% by mass or lower.

In the step (C), the boron nitride particle aggregate is separated from the dispersion obtained by the step (B). The method for separating the boron nitride particle aggregate from the dispersion obtained by the step (B) is not particularly limited, and, for example, static separation, filtration, a centrifuge, or heat treatment may be used.

The boron nitride particle aggregate thus obtained may be further subjected to another treatment. For example, surface oxidation involving temperature treatment under oxygen, steam treatment, surface denaturation with an organometal compound or a polymer using a carrier or a reactive gas at room temperature or under warming, or a sol-gel method using boehmite or $SiO_2$ may be used. These treatments may each be used alone or may be used in combination of two or more thereof.

The boron nitride particle aggregate according to the present embodiment prepared as described above may be further subjected, if necessary, to typical post-processes such as close investigation, pulverization, classification, purification, washing and drying. When the boron nitride particle aggregate contains a fine fraction, the fine fraction may be removed first. The pulverization of the boron nitride particle aggregate may be carried out using a sieving mesh, a classifying mill, a structured roll crusher or a cutting wheel as a method alternative to screening. For example, dry milling treatment in a ball mill may be carried out.

The inorganic filler (C) according to the present embodiment may comprise any of various inorganic fillers known in the art, in addition to the boron nitride particle aggregate mentioned above. Such an inorganic filler is not particularly limited as long as the inorganic filler has insulating properties. Examples thereof include: silicas such as natural silica, fused silica, amorphous silica, and hollow silica; and alumina, aluminum nitride, boron nitride (excluding the boron nitride particle aggregate according to the present embodiment; the same holds true for the description below), boehmite, molybdenum oxide, titanium oxide, silicone rubber, silicone composite powders, zinc borate, zinc stannate, clay, kaolin, talc, calcined clay, calcined kaolin, calcined talc, mica, short glass fibers (fine glass powders such as E glass and D glass), hollow glass, and spherical glass. These inorganic fillers may each be used alone or may be used in combination of two or more thereof.

Among them, at least one inorganic filler selected from the group consisting of silica, alumina, aluminum nitride, and boron nitride is preferably contained therein. In particular, silica is preferred from the viewpoint of low thermal expansion, and alumina, aluminum nitride, or boron nitride is preferred from the viewpoint of high thermal conductivity.

In the resin composition of the present embodiment, a component other than the inorganic filler, such as a silane coupling agent or a wetting dispersant may be used in combination with the inorganic filler (C) in order to improve the dispersibility of fine particles and the adhesion strength between the resin and the fine particles or glass cloth.

The silane coupling agent is not particularly limited as long as the silane coupling agent is generally used in the surface treatment of inorganic matter. Specific examples thereof include: aminosilane-based silane coupling agents such as γ-aminopropyltriethoxysilane and N-β-(aminoethyl)-γ-aminopropyltrimethoxysilane; epoxysilane-based silane coupling agents such as γ-glycidoxypropyltrimethoxysilane; acrylsilane-based silane coupling agents such as γ-acryloxypropyltrimethoxysilane; cationic silane-based silane coupling agents such as N-β-(N-vinylbenzylaminoethyl)-γ-aminopropyltrimethoxysilane hydrochloride; phenylsilane-based silane coupling agents; and styrylsilane-based coupling agents such as p-styryltrimethoxysilane, p-styryltriethoxysilane, p-styrylmethyldimethoxysilane, p-styrylmethyldiethoxysilane, and N-(vinylbenzyl)-2-aminoethyl-3-aminopropyltrimethoxysilane hydrochloride. These silane coupling agents may each be used alone or may be used in combination of two or more thereof.

The wetting dispersant is not particularly limited as long as the wetting dispersant is used as a dispersion stabilizer for paint. Examples thereof include wetting dispersants such as "DISPERBYK-110", "DISPERBYK-ill", "DISPERBYK-118", "DISPERBYK-180", "DISPERBYK-161", "BYK-W996", "BYK-W9010", and "BYK-W903" manufactured by BYK Japan K.K. These wetting dispersants may each be used alone or may be used in combination of two or more thereof.

In the resin composition of the present embodiment, the content of the inorganic filler (C) is not particularly limited and is preferably 1 to 1600 parts by mass, more preferably 50 to 1500 parts by mass, further preferably 80 to 700 parts by mass, based on 100 parts by mass of a resin solid component. The content of the inorganic filler (C) that falls within the range described above is preferred from the viewpoint of characteristics such as heat resistance upon moisture absorption, low thermal expansion, and high thermal conduction.

The content of the boron nitride particle aggregate in the resin composition is more preferably 20 to 200 parts by mass, still more preferably 30 to 140 parts by mass, based on 100 parts by mass of a resin solid component. When the content of the boron nitride particle aggregate in the resin composition is 200 parts by mass or smaller, more favorable copper foil peel strength tends to be obtained. When the content of the boron nitride particle aggregate in the resin composition is 20 parts by mass or larger, better thermal conductivity tends to be obtained.

In the present embodiment, the content of the boron nitride particle aggregate in the inorganic filler (C) is not particularly limited and is preferably 1 to 100 parts by mass, more preferably 5 to 100 parts by mass, still more preferably 10 to 100 parts by mass, further preferably 50 to 100 parts by mass, still further preferably 90 to 100 parts by mass, based on 100 parts by mass of the inorganic filler (C). When the content of the boron nitride particle aggregate falls within the range described above, the orientation tends to be further improved.

[Other Components]

The resin composition of the present embodiment can comprise other components in addition to the components described above, without impairing the desired characteristics of the present embodiment. In the present embodiment, the resin composition preferably further comprises one or more selected from the group consisting of: a cyanate compound other than the cyanate compound (A) represented by the formula (1) and the cyanate compound (A) represented by the formula (2); an epoxy resin; an oxetane resin; a phenol resin; a benzoxazine compound; and a compound having a polymerizable unsaturated group, from the viewpoint of further improving physical properties. Specific examples of the cyanate compound other than the cyanate compound (A) represented by the formula (1) and the cyanate compound (A) represented by the formula (2) include, but are not particularly limited to, cyanate compounds as mentioned above.

(Epoxy Resin)

The resin composition of the present embodiment comprising an epoxy resin tends to have better adhesion properties, heat resistance upon moisture absorption, flexibility, etc. A generally known epoxy resin can be used as long as the epoxy resin is a compound having two or more epoxy groups in one molecule. The type of the epoxy resin is not particularly limited. Specific examples thereof include bisphenol A-based epoxy resin, bisphenol E-based epoxy resin, bisphenol F-based epoxy resin, bisphenol S-based epoxy resin, bisphenol A novolac-based epoxy resin, biphenyl-based epoxy resin, phenol novolac-based epoxy resin, cresol novolac-based epoxy resin, xylene novolac-based epoxy resin, polyfunctional phenol-based epoxy resin, naphthalene-based epoxy resin, naphthalene skeleton-modified novolac-based epoxy resin, naphthylene ether-based epoxy resin, phenol aralkyl-based epoxy resin, anthracene-based epoxy resin, trifunctional phenol-based epoxy resin, tetrafunctional phenol-based epoxy resin, triglycidyl isocyanurate, glycidyl ester-based epoxy resin, alicyclic epoxy resin, dicyclopentadiene novolac-based epoxy resin, biphenyl novolac-based epoxy resin, phenol aralkyl novolac-based epoxy resin, naphthol aralkyl novolac-based epoxy resin, aralkyl novolac-based epoxy resin, biphenyl aralkyl-based epoxy resin, naphthol aralkyl-based epoxy resin, dicyclopentadiene-based epoxy resin, polyol-based epoxy resin, phosphorus-containing epoxy resin, glycidylamine, compounds prepared by the epoxidation of a double bond in butadiene or the like, compounds obtained through the reaction of hydroxy group-containing silicone resins with epichlorohydrin, and halides thereof. These epoxy resins can each be used alone or can be used in combination of two or more thereof.

Among them, the epoxy resin is preferably one or more resins selected from the group consisting of biphenyl aralkyl-based epoxy resin, naphthylene ether-based epoxy resin, polyfunctional phenol-based epoxy resin, and naphthalene-based epoxy resin. The resin composition comprising such an epoxy resin tends to further improve the flame retardancy and heat resistance of the resulting cured product.

The content of the epoxy resin is not particularly limited and is preferably 0 to 99 parts by mass, more preferably 1 to 90 parts by mass, further preferably 3 to 80 parts by mass, based on 100 parts by mass of a resin solid component in the resin composition. The content of the epoxy resin falls within the range described above, whereby adhesion properties, flexibility, etc. tend to be better.

(Oxetane Resin)

The resin composition of the present embodiment comprising an oxetane resin tends to have better adhesion properties, flexibility, etc. A generally known oxetane resin can be used, and the type of the oxetane resin is not particularly limited. Specific examples thereof include oxetane, alkyloxetanes such as 2-methyloxetane, 2,2-dimethyloxetane, 3-methyloxetane, and 3,3-dimethyloxetane, 3-methyl-3-methoxymethyloxetane, 3,3'-di(trifluoromethyl) perfluorooxetane, 2-chloromethyloxetane, 3,3-bis(chloromethyl)oxetane, biphenyl-based oxetane, OXT-101 (trade name, manufactured by Toagosei Co., Ltd.), and OXT-121 (trade name, manufactured by Toagosei Co., Ltd.). These oxetane resins can each be used alone or can be used in combination of two or more thereof.

The content of the oxetane resin is not particularly limited and is preferably 0 to 99 parts by mass, more preferably 1 to 90 parts by mass, further preferably 3 to 80 parts by mass, based on 100 parts by mass of a resin solid component in the resin composition. The content of the oxetane resin falls within the range described above, whereby close contact, flexibility, etc. tend to be better.

(Phenol Resin)

The resin composition of the present embodiment comprising a phenol resin tends to have better adhesion properties, flexibility, etc. A generally known phenol resin can be used as long as the phenol resin has two or more hydroxy groups in one molecule. The type of the phenol resin is not particularly limited. Specific examples thereof include, but are not particularly limited to, bisphenol A-based phenol resin, bisphenol E-based phenol resin, bisphenol F-based phenol resin, bisphenol S-based phenol resin, phenol novolac resin, bisphenol A novolac-based phenol resin, glycidyl ester-based phenol resin, aralkyl novolac-based phenol resin, biphenyl aralkyl-based phenol resin, cresol novolac-based phenol resin, polyfunctional phenol resin, naphthol resin, naphthol novolac resin, polyfunctional naphthol resin, anthracene-based phenol resin, naphthalene skeleton-modified novolac-based phenol resin, phenol aralkyl-based phenol resin, naphthol aralkyl-based phenol resin, dicyclopentadiene-based phenol resin, biphenyl-based phenol resin, alicyclic phenol resin, polyol-based phenol resin, phosphorus-containing phenol resin, and hydroxy group-containing silicone resins. These phenol resins can each be used alone or can be used in combination of two or more thereof.

The content of the phenol resin is not particularly limited and is preferably 0 to 99 parts by mass, more preferably 1 to 90 parts by mass, further preferably 3 to 80 parts by mass, based on 100 parts by mass of a resin solid component in the resin composition. The content of the phenol resin falls within the range described above, whereby adhesion properties, flexibility, etc. tend to be better.

(Benzoxazine Compound)

The resin composition of the present embodiment comprising a benzoxazine compound tends to have better flame retardancy, better heat resistance, lower water absorbability, lower dielectric performance, etc. A generally known benzoxazine compound can be used as long as the compound has two or more dihydrobenzoxazine rings in one molecule. The type of the benzoxazine compound is not particularly limited. Specific examples thereof include bisphenol A-based benzoxazine BA-BXZ (trade name, manufactured by Konishi Chemical Ind. Co., Ltd.), bisphenol F-based benzoxazine BF-BXZ (trade name, manufactured by Konishi Chemical Ind. Co., Ltd.), and bisphenol S-based benzoxazine BS-BXZ (trade name, manufactured by Konishi Chemical Ind. Co., Ltd.). These benzoxazine compounds can each be used alone or can be used as a mixture of two or more thereof.

The content of the benzoxazine compound is not particularly limited and is preferably 0 to 99 parts by mass, more preferably 1 to 90 parts by mass, further preferably 3 to 80 parts by mass, based on 100 parts by mass of a resin solid component in the resin composition. The content of the benzoxazine compound falls within the range described above, whereby heat resistance, etc. tend to be better.

(Compound Having Polymerizable Unsaturated Group)

The resin composition of the present embodiment comprising a compound having a polymerizable unsaturated group tends to have better heat resistance, toughness, etc. A generally known compound having a polymerizable unsaturated group can be used, and the type of the compound is not particularly limited. Specific examples thereof include: vinyl compounds such as ethylene, propylene, styrene, divinylbenzene, and divinylbiphenyl; (meth)acrylates of monohydric or polyhydric alcohols, such as methyl (meth)acrylate, 2-hydroxyethyl (meth)acrylate, 2-hydroxypropyl (meth) acrylate, polypropylene glycol di(meth)acrylate, trimethylolpropane di(meth)acrylate, trimethylolpropane tri(meth) acrylate, pentaerythritol tetra(meth)acrylate, and dipentaerythritol hexa(meth)acrylate; epoxy (meth)acrylates such as bisphenol A-based epoxy (meth)acrylate and bisphenol F-based epoxy (meth)acrylate; benzocyclobutene resin; and (bis)maleimide resin. These compounds having an unsaturated group can each be used alone or can be used as a mixture of two or more thereof.

The content of the compound having a polymerizable unsaturated group is not particularly limited and is preferably 0 to 99 parts by mass, more preferably 1 to 90 parts by mass, further preferably 3 to 80 parts by mass, based on 100 parts by mass of a resin solid component in the resin composition. The content of the compound having a polymerizable unsaturated group falls within the range described above, whereby heat resistance, toughness, etc. tend to be better.

(Polymerization Catalyst and Curing Accelerator)

The resin composition of the present embodiment can be further supplemented with a polymerization catalyst which catalyzes the polymerization of the cyanate compound, the epoxy resin, the oxetane resin, or the compound having a polymerizable unsaturated group, and/or a curing accelerator for appropriately adjusting a curing rate, in addition to the compounds or the resins described above. A generally known polymerization catalyst and/or curing accelerator can be used, and the type of the polymerization catalyst and/or the curing accelerator is not particularly limited. Specific examples thereof include: metal salts such as zinc octanoate, zinc naphthenate, cobalt naphthenate, copper naphthenate, and iron acetylacetonate; organometal salts such as nickel octanoate and manganese octanoate; phenol compounds such as phenol, xylenol, cresol, resorcin, catechol, octylphenol, and nonylphenol; alcohols such as 1-butanol and 2-ethylhexanol; imidazole derivatives such as 2-methylimidazole, 2-ethyl-4-methylimidazole, 2-phenylimidazole, 1-cyanoethyl-2-phenylimidazole, 1-cyanoethyl-2-ethyl-4-methylimidazole, 2-phenyl-4,5-dihydroxymethylimidazole, and 2-phenyl-4-methyl-5-hydroxymethylimidazole; derivatives such as carboxylic acid or carboxylic anhydride adducts of these imidazoles; amine compounds such as dicyandiamide, benzyldimethylamine, and 4-methyl-N,N-dimethylbenzylamine; phosphorus compounds such as phosphine compounds, phosphine oxide compounds, phosphonium compounds, and diphosphine compounds; peroxides such as epoxy-imidazole adduct compounds, benzoyl peroxide, p-chlorobenzoyl peroxide, di-t-butyl peroxide, diisopropyl peroxycarbonate, and di-2-ethylhexyl peroxycarbonate; and azo compounds such as azobisisobutyronitrile. These catalysts may be commercially available. Examples thereof include Amicure PN-23 (manufactured by Ajinomoto Fine-Techno Co., Inc.), Novacure HX-3721 (manufactured by Asahi Kasei Corp.), and Fujicure FX-1000 (manufactured by Fuji Kasei Kogyo Co., Ltd.). These polymerization catalysts and/or curing accelerators can each be used alone or can be used as a mixture of two or more thereof.

The content of the polymerization catalyst and the curing accelerator can be appropriately adjusted in consideration of the degree of resin curing, the viscosity of the resin composition, etc. The content is not particularly limited and is usually preferably 0.005 to 10 parts by mass based on 100 parts by mass of a resin solid component in the resin composition.

(Other Additives)

The resin composition of the present embodiment may further contain, if necessary, additives known in the art such as other thermosetting resins, thermoplastic resins and oligomers thereof, various polymer compounds such as elastomers, curing catalysts, curing accelerators, coloring pigments, antifoaming agents, surface conditioners, frame retardants, solvents, ultraviolet absorbers, antioxidants, photopolymerization initiators, fluorescent whitening agents, photosensitizers, dyes, pigments, thickeners, lubricants, flow modifiers, dispersants, leveling agents, brightening agents, polymerization inhibitors, and silane coupling agents. The resin composition may also contain a solvent, if necessary. These optional additives can each be used alone or can be used as a mixture of two or more thereof.

A generally known flame retardant can be used, and the type of the flame retardant is not particularly limited. Specific examples thereof include: bromine compounds such as 4,4'-dibromobiphenyl; phosphoric acid ester; melamine phosphate; phosphorus-containing epoxy resin; nitrogen compounds such as melamine and benzoguanamine; oxazine ring-containing compounds; and silicone compounds.

The resin composition according to the present embodiment can employ an organic solvent, if necessary. In this case, the resin composition of the present embodiment can be used in a form in which at least a portion, preferably the whole, of various resin components mentioned above is dissolved or compatibilized in the organic solvent (solution or varnish).

The solvent is not particularly limited, and a generally known solvent can be used as long as at least a portion, preferably the whole, of various resin components mentioned above can be dissolved or compatibilized therein. Specific examples thereof include: ketone-based solvents such as acetone, methyl ethyl ketone, methyl isobutyl ketone, and cyclohexanone; cellosolve-based solvents such as propylene glycol monomethyl ether and propylene glycol monomethyl ether acetate; ester-based solvents such as ethyl lactate, methyl acetate, ethyl acetate, butyl acetate, isoamyl acetate, ethyl lactate, methyl methoxypropionate, and methyl hydroxyisobutyrate; polar solvents such as amides such as dimethylacetamide and dimethylformamide; alcohol-based solvents such as methanol, ethanol, isopropanol, and 1-ethoxy-2-propanol; and aromatic hydrocarbons such as toluene, xylene, and anisole. These solvents can each be used alone or can be used as a mixture of two or more thereof.

[Method for Producing Resin Composition]

The resin composition of the present embodiment can be prepared according to a routine method. For example, a preferred method involves obtaining a resin composition homogeneously containing the cyanate compound (A) and/or the maleimide compound (B), the inorganic filler (C), and other optional components mentioned above. Specifically, for example, these components can be sequentially added to a solvent and fully stirred to readily prepare the resin composition of the present embodiment.

An organic solvent can be used, if necessary, in the preparation of the resin composition of the present embodiment. The type of the organic solvent is not particularly limited as long as the solvent is capable of dissolving the resins in the resin composition. Specific examples thereof are as listed above.

Treatment (stirring, mixing, kneading treatment, etc.) known in the art for uniformly dissolving or dispersing each component can be carried out in the preparation of the resin composition. For example, the inorganic filler can be uniformly dispersed by stirring and dispersion treatment using a stirring vessel equipped with a stirrer having an appropriate stirring ability. This enhances the dispersibility of the inorganic filler in the resin composition. The stirring, mixing, or kneading treatment can be appropriately carried out using an apparatus known in the art such as an apparatus aimed at mixing, for example, a ball mill or a bead mill, or a revolution- or rotation-type mixing apparatus.

[Prepreg]

The prepreg of the present embodiment comprises a base material (D), and the resin composition of the present embodiment with which the base material (D) is impregnated or coated. The prepreg of the present embodiment can be obtained, for example, by combining the resin composition with the base material (D), specifically, impregnating or coating the base material (D) with the resin composition. The method for producing the prepreg of the present embodiment is not particularly limited and can be carried out according to a routine method. Examples thereof include a method which involves impregnating or coating the base material (D) with the resin composition, followed by semi-curing (conversion to B-stage) by heating or the like for 1 to 30 minutes in a drier of 100 to 200° C. to obtain the prepreg. In the present embodiment, the amount of the resin composition based on the total amount of the prepreg is not particularly limited and is preferably in the range of 30 to 90% by mass.

The base material (D) for use in the prepreg of the present embodiment is not particularly limited and can be appropriately selected for use from various printed circuit board materials known in the art according to the intended purpose or performance. Specific examples thereof include, but are not limited to: glass fibers such as E glass, D glass, S glass, Q glass, spherical glass, NE glass, and T glass; non-glass inorganic fibers such as quartz; wholly aromatic polyamides such as poly-p-phenyleneterephthalamide (Kevlar®), manufactured by Du Pont K.K.) and co-poly-p-phenylene/3,4'- oxydiphenylene/terephthalamide (Technora®), manufactured by Teijin Techno Products, Ltd.); polyesters such as 2,6-hydroxynaphthoic acid/p-hydroxybenzoic acid (Vectran®), manufactured by Kuraray Co., Ltd.); and organic fibers such as poly-p-phenylene benzoxazole (Zylon®), manufactured by Toyobo Co., Ltd.) and polyimide.

Among them, E glass cloth, T glass cloth, S glass cloth, Q glass cloth, or an organic fiber is preferred from the viewpoint of low thermal expansion.

These base materials (D) may each be used alone or may be used in combinations of two or more thereof.

Examples of the form of the base material (D) include, but are not particularly limited to, woven fabrics, nonwoven fabrics, lobings, chopped strand mats, and surfacing mats. The textures of the woven fabrics are not particularly limited, and, for example, plain weave, mat weave, and twill weave are known. The base material (D) can be appropriately selected for use from these materials known in the art according to the intended purpose or performance. Such a base material (D) subjected to opening treatment or a glass woven fabric surface-treated with a silane coupling agent or the like is preferably used. The base material (D) is not particularly limited by its thickness and mass. Usually, the base material of approximately 0.01 to 0.3 mm is preferably used. In particular, the base material (D) is preferably a glass woven fabric having a thickness of 200 μm or smaller and a mass of 250 g/m² or smaller, more preferably a glass woven fabric made of, for example, E glass, S glass, or T glass fiber, from the viewpoint of strength and water absorbability.

The laminate of the present embodiment has one or more layers of at least one material selected from the group consisting of the prepreg mentioned above and a resin sheet mentioned later and comprises a cured product of the resin composition contained in the at least one material selected from the group consisting of the aforementioned prepreg and resin sheet. This laminate can be obtained by curing one or more layers of, for example, the prepreg. The metal foil-clad laminate of the present embodiment is a metal foil-clad laminate having at least one material selected from the group consisting of the aforementioned prepreg and resin sheet, and a metal foil disposed on one side or both sides of the at least one material selected from the group consisting of the aforementioned prepreg and resin sheet, and comprises a cured product of the resin composition contained in the at least one material selected from the group consisting of the aforementioned prepreg and resin sheet. This metal foil-clad laminate can be obtained by laminating, for example, the prepreg, with a metal foil, followed by curing. Specifically, the metal foil-clad laminate of the present embodiment can be obtained by providing at least one or more layers of, for example, the prepreg, and disposing the metal foil on one side or both sides thereof, followed by lamination molding. More specifically, the metal foil-clad laminate can be produced by providing one or more layers of the aforementioned prepreg, disposing the metal (e.g., copper or aluminum) foil on one side or both sides thereof, if desired, and lamination-molding this construct according to the need. In this context, the metal foil used is not particularly limited as long as the metal foil can be used as a printed circuit board material. A copper foil known in the art such as a rolled copper foil or an electrolytic copper foil is preferred. The thickness of the metal foil is not particularly limited and is preferably 1 to 70 μm, more preferably 1.5 to 35 μm. The metal foil-clad laminate is not particularly limited by its molding method and molding conditions and can be molded by use of a general approach and conditions for laminates for printed circuit boards and multilayer boards. For example, a multiplaten press, a multiplaten vacuum press, a continuous molding machine, or an autoclave molding machine can be used in the molding of the metal foil-clad laminate. The metal foil-clad laminate is generally molded at a temperature of 100 to 300° C. and a pressure of 2 to 100 kgf/cm² in terms of surface pressure for a heating time in the range of 0.05 to 5 hours. If necessary, post curing may be further carried out at a temperature of 150 to 300° C. Alternatively, the prepreg may be lamination-molded in combination with a separately prepared wiring board for an inner layer to obtain a multilayer board.

The metal foil-clad laminate of the present embodiment can be preferably used as a printed circuit board by forming a predetermined wiring pattern. The metal foil-clad laminate of the present embodiment has a low coefficient of thermal expansion and favorable moldability, metal foil peel strength, and chemical resistance (particularly, desmear resistance) and can thus be used particularly effectively as a printed circuit board for semiconductor packages required to have such performance.

[Resin Sheet]

The resin sheet of the present embodiment refers to a support and a layer of the resin composition disposed on the surface of the support (multilayer sheet) and also refers to the resin composition layer alone (monolayer sheet) after removal of the support. Specifically, the resin sheet of the present embodiment comprises at least the resin composition of the present embodiment. The resin sheet is used as an approach for thinning and can be produced, for example, by directly coating a support such as a metal foil or a film with a thermosetting resin (containing an inorganic filler) for use in prepregs, etc., followed by drying.

For the resin sheet of the present embodiment, it is preferred that the ratio of <002> X-ray diffraction intensity to <100> X-ray diffraction intensity (I<002>/I<100>) be 30 or less. In this context, the ratio of <002> X-ray diffraction intensity to <100> X-ray diffraction intensity (I<002>/I<100>) is the peak intensity ratio of a <002> diffraction line to a <100> diffraction line (I<002>/I<100>) obtained by irradiation with X-ray at an angle of 90° based on the thickness direction of the sheet comprising the resin composition, i.e., the length direction of the sheet. In the present embodiment, the intensity ratio of 30 or less indicates that the orientation is sufficiently high. The resulting resin sheet tends to have higher thermal conductivity.

The support for use in the production of the resin sheet of the present embodiment is not particularly limited, and any of various printed circuit board materials known in the art can be used. Examples thereof include polyimide films, polyamide films, polyester films, polyethylene terephthalate (PET) films, polybutylene terephthalate (PBT) films, polypropylene (PP) films, polyethylene (PE) films, aluminum foils, copper foils, and gold foils. Among them, an electrolytic copper foil or a PET film is preferred.

The resin sheet of the present embodiment is particularly preferably prepared by coating the support with the resin composition described above, followed by semi-curing (conversion to B-stage). The method for producing the resin sheet of the present embodiment is generally preferably a method for producing a composite of a B-stage resin and a support. Specific examples thereof include a method which involves coating the support such as a copper foil with the resin composition, followed by semi-curing by a method such as heating for 1 to 60 minutes in a drier of 100 to 200° C. to produce the resin sheet. The amount of the resin composition applied to the support is preferably in the range of 1 to 300 µm in terms of the resin thickness of the resin sheet.

The resin sheet of the present embodiment may be used as, for example, a buildup material for printed circuit boards.

The laminate of the present embodiment can be obtained by curing one or more layers of, for example, the resin sheet. The metal foil-clad laminate of the present embodiment can be obtained by laminating, for example, the resin sheet, with a metal foil, followed by curing. Specifically, the metal foil-clad laminate of the present embodiment can be obtained by using, for example, the resin sheet, and disposing the metal foil on one side or both sides thereof, followed by lamination molding. More specifically, the metal foil-clad laminate can be produced by providing, for example, one layer of the resin sheet mentioned above or two or more layers of the resin sheet separated from its support, if desired, disposing the metal (e.g., copper or aluminum) foil on one side or both sides thereof, and lamination-molding this construct according to the need. In this context, the metal foil used is not particularly limited as long as the metal foil can be used as a printed circuit board material. A copper foil known in the art such as a rolled copper foil or an electrolytic copper foil is preferred. The metal foil-clad laminate is not particularly limited by its molding method and molding conditions and can be molded by use of a general approach and conditions for laminates for printed circuit boards and multilayer boards. For example, a multi-platen press, a multiplaten vacuum press, a continuous molding machine, or an autoclave molding machine can be used in the molding of the metal foil-clad laminate. The metal foil-clad laminate is generally molded at a temperature of 100 to 300° C. and a pressure of 2 to 100 kgf/cm$^2$ in terms of surface pressure for a heating time in the range of 0.05 to 5 hours. If necessary, post curing may be further carried out at a temperature of 150 to 300° C.

The laminate of the present embodiment may be a laminate obtained by curing one or more layers of the resin sheet and one or more layers of the prepreg or may be a metal foil-clad laminate obtained by curing a metal foil laminated with the resin sheet and the prepreg.

In the case of not adopting the form of the metal foil-clad laminate in the present embodiment, an electroless plating approach may be used for forming a conductor layer that serves as a circuit and preparing a printed circuit board.

The printed circuit board of the present embodiment is a printed circuit board comprising an insulating layer and a conductor layer formed on the surface of this insulating layer, wherein this insulating layer comprises the resin composition described above.

The printed circuit board of the present embodiment is prepared, for example, by forming a conductor layer that serves as a circuit by use of a metal foil or electroless plating on the insulating layer. The conductor layer is generally constituted by copper or aluminum. The insulating layer for printed circuit boards with the conductor layer formed thereon can be preferably used as a printed circuit board by forming a predetermined wiring pattern. The printed circuit board of the present embodiment can be particularly effectively used as a printed circuit board for semiconductor packages, because by virtue of the insulating layer comprising the resin composition described above, the printed circuit board maintains the excellent elastic modulus even at a reflow temperature during semiconductor packaging and thereby effectively suppresses the warpage of semiconductor plastic packages, and is excellent in metal foil peel strength and desmear resistance.

Specifically, the printed circuit board of the present embodiment can be produced by, for example, the following method: first, the metal foil-clad laminate (copper-clad laminate, etc.) described above is provided. The surface of the metal foil-clad laminate is subjected to etching treatment for the formation of an inner layer circuit to prepare an inner layer substrate. The inner layer circuit surface of this inner layer substrate is subjected, if necessary, to surface treatment for enhancing adhesion strength. Subsequently, a required number of the prepreg described above is laminated on the resulting inner layer circuit surface. Further, a metal foil for an outer layer circuit is laterally laminated thereon, followed by integral molding under heat and pressure. In this way, a multilayer laminate is produced in which the insulating layer composed of the base material and a cured product of the thermosetting resin composition is formed between the inner layer circuit and the metal foil for an outer layer circuit. Subsequently, this multilayer laminate is processed by hole drilling for through-holes or via holes and then subjected to desmear treatment for removing smear, which is a residue of resins derived from the resin components contained in the cured product layer. Then, the inside walls of these holes are coated with a metal plating film for the community between the inner layer circuit and the metal foil for an outer layer circuit. The metal foil for an outer layer circuit is further subjected to etching treatment for the formation of the outer layer circuit to produce the printed circuit board.

In the printed circuit board of the present embodiment, for example, the prepreg described above (base material impregnated with the resin composition described above), the resin sheet described above, or the resin composition layer of the metal foil-clad laminate (layer composed of the resin composition described above) constitutes the insulating layer comprising the resin composition described above.

EXAMPLES

Hereinafter, the present embodiment will be more specifically described with reference to Examples and Comparative Examples. The present embodiment is not intended to be limited by Examples described below by any means.

<Methods for Evaluating Characteristics>

(1) Thermal Conductivity

The whole copper foils on both sides of a double-sided copper-clad laminate having an insulating layer thickness of 0.8 mm as mentioned later were removed by etching. Then, a test specimen (10 mm×10 mm×1 mm in thickness) was cut out therefrom. The thermal conductivity of this test specimen was measured by laser flash using a xenon flash analyzer LFA447 thermal conductivity meter manufactured by NETZSCH.

(2) Copper Foil Peel Strength

A test specimen (30 mm×150 mm×0.8 mm in thickness) of a double-sided copper-clad laminate having an insulating layer thickness of 0.8 mm as mentioned later was used. According to the Test methods of copper-clad laminates for printed wiring boards of JIS C6481 (see 5.7 Peel strength), the copper foil peel strength was measured three times, and an average value of the lower limit values was used as a measurement value.

(3) Heat Resistance Upon Moisture Absorption

The whole copper foils, except for half the copper foil on one side, of a double-sided copper-clad laminate (50 mm×50 mm×0.8 mm in insulating layer thickness) were removed by etching to obtain a test specimen. The obtained test specimen was treated at 121° C. at 2 atm for 1 hour or 3 hours using a pressure cooker tester (manufactured by Hirayama Manufacturing Corp., PC-3) and then dipped in solder of 260° C. for 60 seconds. The test was conducted for each of 3 samples. The presence or absence of swelling after the dipping was visually observed, and the heat resistance upon moisture absorption was evaluated according to evaluation criteria described below. Specifically, the heat resistance upon moisture absorption in each of Examples and Comparative Examples was evaluated on a scale from 0 to 3 according to the number of samples evaluated as ◯.
◯: No abnormality.
X: Swelling occurred.

[Synthesis Example 1] Synthesis of Cyanate Compound of Diallyl Bisphenol A (Hereinafter, Abbreviated to DABPA-CN)

700 g (hydroxyl group equivalent: 154.2 g/eq.) (4.54 mol based on OH groups) of diallyl bisphenol A (DABPA, manufactured by Daiwa Fine Chemicals Co., Ltd.) and 459.4 g (4.54 mol) (1.0 mol per mol of hydroxyl groups) of triethylamine were dissolved in 2100 g of dichloromethane to prepare solution 1.

The solution 1 was poured over 90 minutes to 474.4 g (7.72 mol) (1.7 mol per mol of hydroxyl groups) of cyanogen chloride, 1106.9 g of dichloromethane, 735.6 g (7.26 mol) (1.6 mol per mol of hydroxyl groups) of 36% hydrochloric acid, and 4560.7 g of water with stirring while the liquid temperature was kept at −2 to −0.5° C. After the completion of the pouring of the solution 1, the mixture was stirred at the same temperature as above for 30 minutes. Then, a solution containing 459.4 g (4.54 mol) (1.0 mol per mol of hydroxyl groups) of triethylamine dissolved in 459.4 g of dichloromethane (solution 2) was poured thereto over 25 minutes. After the completion of the pouring of the solution 2, the mixture was stirred at the temperature as above for 30 minutes to complete the reaction.

Then, the reaction solution was left standing and thereby separated into an organic phase and an aqueous phase. The obtained organic phase was washed with 2 L of 0.1 N hydrochloric acid and then washed with 2000 g of water six times. The electrical conductivity of an effluent discharged from the 6th washing with water was 20 µS/cm to confirm that ionic compounds removable by washing with water were thoroughly removed.

The organic phase thus washed with water was concentrated under reduced pressure and finally concentrated to dryness at 90° C. for 1 hour to obtain 805 g of the target cyanate compound DABPA-CN (pale yellow liquid). The IR spectrum of the obtained cyanate compound DABPA-CN exhibited absorption of 2264 cm$^{-1}$ (cyanic acid ester group) and exhibited no absorption of hydroxyl groups.
(Measurement of Particle Size)

In order to confirm the form of a boron nitride particle aggregate mentioned later, a plurality of SEM observation images of 2.5 µm×1.8 µm rectangle were analyzed under an electron microscope (FE-SEM-EDX (SU8220); manufactured by Hitachi High-Technologies Corp.). Then, measurements were conducted for R and r of primary boron nitride particles (boron nitride particle aggregate), which were present within the observation range described above and aggregated such that (0001) planes of primary boron nitride particles were stacked on top of each other. The shape of the boron nitride particles observed in the SEM images was approximated to the rectangle as shown in FIG. 1(b). Thus, the length of a side corresponding to R and the length of a side corresponding to r were measured.

[Synthesis Example 2-1] Production of Boron Nitride Particle Aggregate A

To primary hexagonal boron nitride particles having an average particle size of 0.5 µm ("UHP-S2" manufactured by Showa Denko K.K.), 1.5% by mass of phenyltrimethoxysilane (manufactured by Tokyo Chemical Industry Co., Ltd.) was added dropwise as a coupling agent, and the mixture was stirred using a mixer to obtain coupling agent-added primary hexagonal boron nitride particles. Subsequently, the coupling agent-added primary hexagonal boron nitride particles were added to methyl ethyl ketone and fully dispersed in an ultrasonic dispersing machine to obtain a dispersion. This dispersion was left standing for 6 hours, and the supernatant was removed to obtain boron nitride particle aggregate A. This boron nitride particle aggregate A was further ultrasonically dispersed in ethanol and spread over an aluminum foil. After evaporation of the solvent, the resulting boron nitride particle aggregate A was pressed against carbon tape, and SEM images of the boron nitride particle aggregate A were observed. The results are shown in FIGS. 2 (a) and 2(b).

Figure 2A:
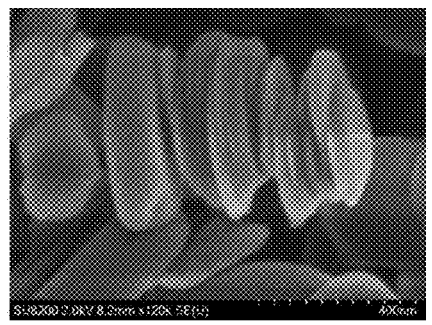
FIG. 2(a) shows a SEM image at a magnification of ×120000 of a boron nitride particle aggregate according to Example 1.
Figure 2B:
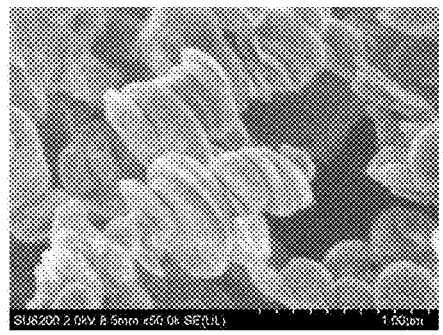
FIG. 2(b) shows a SEM image at a magnification of ×50000 of the boron nitride particle aggregate according to Example 1.
Figure 4:
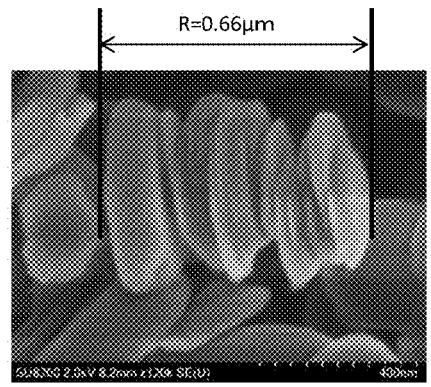
FIG. 4 shows a diagram showing the scale of a boron nitride particle aggregate observed in FIG. 2(a).
Figure 5:
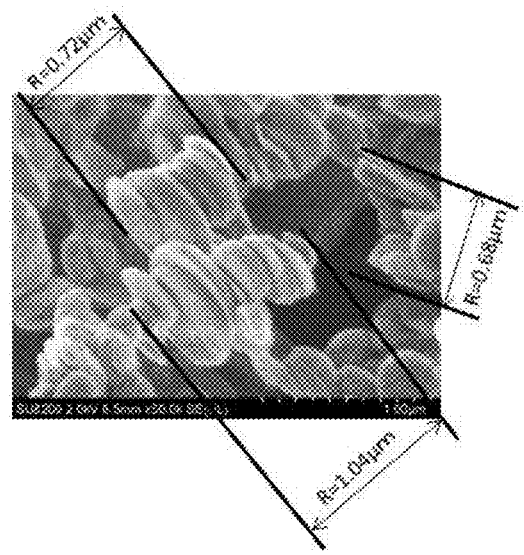
FIG. 5 shows a diagram showing the scale of three boron nitride particle aggregates observed in FIG. 2(b).

In the SEM images shown in FIGS. 2(a) and 2(b), a larger number of end faces of the primary hexagonal boron nitride particles were observed than the number of (0001) planes of the primary hexagonal boron nitride particles, demonstrating that 80% or more primary boron nitride particles aggregated such that their (0001) planes were stacked on top of each other, to thereby form the boron nitride particle aggregate A. In short, the boron nitride particle aggregate A comprised 80% or more primary boron nitride particles (boron nitride particle aggregate) which aggregated such that their (0001) planes were stacked on top of each other. As for the boron nitride particle aggregate shown in FIG. 2(a), the number of primary hexagonal boron nitride particles per layer was 1, and the longest diameter R in the layering direction of this boron nitride particle aggregate and the longest diameter r in the width direction of the boron nitride particle aggregate were measured and were consequently R=0.66 µm and r=0.49 µm with R/r=1.35. R was identified as shown in FIG. 4. Three boron nitride particle aggregates (boron nitride particle aggregates 1 to 3) particularly having a typical pillar shape were selected from FIG. 2(b), and their particle sizes were measured by the method mentioned above. The number of primary hexagonal boron nitride particles per layer was 1 for all the boron nitride particle aggregates 1 to 3. These boron nitride particle aggregates were charged, and the SEM image was distorted. Results of determining r and R of the boron nitride particle aggregates 1 to 3 are shown in Table 1. Their R was identified as shown in FIG. 5.

TABLE 1

| Boron nitride particles observed in Synthesis Example 2-1 | R (µm) | r (µm) | R/r |
|---|---|---|---|
| Boron nitride particle aggregate 1 | 1.04 | 0.76 | 1.37 |
| Boron nitride particle aggregate 2 | 0.72 | 0.64 | 1.13 |
| Boron nitride particle aggregate 3 | 0.68 | 0.50 | 1.36 |

Figure 3A:
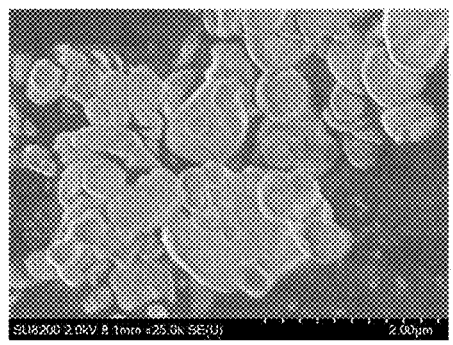
FIG. 3(a) shows a SEM image at a magnification of ×25000 of unaggregated primary hexagonal boron nitride particles, i.e., conventional primary hexagonal boron nitride particles.
Figure 3B:
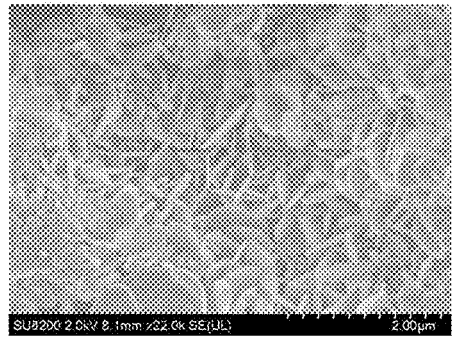
FIG. 3(b) shows a side view of a portion in a SEM image of primary hexagonal boron nitride particles including unaggregated primary hexagonal boron nitride particles.

UHP-S2 before surface treatment with the coupling agent was also subjected to SEM observation in the same way as above. The SEM observation image is shown in FIG. 3(a). As is evident from FIG. 3(a), the (0001) planes of many primary hexagonal boron nitride particles were observed to face the upper surface of the sample. In short, a structure, where (0001) planes of the primary hexagonal boron nitride particles were stacked on top of each other, was not observed. As shown in FIG. 3(b), the surface direction of the end faces of some primary hexagonal boron nitride particles observed agreed with the thickness direction of the sample. The shapes of the boron nitride particles observed in these SEM images were approximated to the rectangle shown in FIG. 1(a). The length of a side corresponding to R and the length of a side corresponding to r were measured. The longest diameters r' in the width direction of the primary hexagonal boron nitride particles were 0.3 to 1.0 µm, and the longest diameters R' of the primary hexagonal boron nitride particles in a direction perpendicular to the width direction were 0.01 to 0.05 µm. In short, all the primary hexagonal boron nitride particles observed satisfied R'<0.3r'.

[Synthesis Example 2-2] Production of Boron Nitride Particle Aggregate B

Boron nitride particle aggregate B was obtained in the same way as in Synthesis Example 2-1 except that primary hexagonal boron nitride particles having an average particle size of 1.0 µm ("MBN-010T" manufactured by Mitsui Chemicals, Inc.) were used instead of UHP-S2. Subsequently, SEM observation was conducted in the same way as in Synthesis Example 2-1 to confirm that the boron nitride particle aggregate B had a layered structure where (0001) planes of the primary hexagonal boron nitride particles were stacked on top of each other. The boron nitride particle aggregate B comprised 20 to 30% primary boron nitride particles (boron nitride particle aggregate) which aggregated such that their (0001) planes were stacked on top of each other. On the other hand, MBN-010T before surface treatment with the coupling agent was also subjected to SEM observation in the same way as above and was consequently unable to be confirmed to have a layered structure where (0001) planes of the primary hexagonal boron nitride particles were stacked on top of each other.

Example 1-1

50 parts by mass of DABPA-CN (allyl equivalent: 179.2 g/eq.) obtained in Synthesis Example 1, 50 parts by mass of a novolac-based maleimide compound (manufactured by Daiwa Fine Chemicals Co., Ltd., "BMI-2300", functional maleimide equivalent: 186 g/eq.), 15.0 parts by mass of a silane coupling agent (Z6040, manufactured by Dow Corning Toray Co., Ltd.), and 5.0 parts by mass of an acid group-containing wetting dispersant (BYK-W903, manufactured by BYK Japan K.K.) were dissolved and mixed in methyl ethyl ketone. To this mixture, 140 parts by mass of the boron nitride particle aggregate A obtained in Synthesis Example 2-1, 1.0 part by mass of a dispersant (manufactured by BYK Japan K.K., "DISPERBYK-161"), 1.0 part by mass of wetting dispersant 1 (manufactured by BYK Japan K.K., "DISPERBYK-ill"), 0.3 parts by mass of wetting dispersant 2 (manufactured by BYK Japan K.K., "DISPERBYK-2009"), 0.50 parts by mass of triphenylimidazole (manufactured by Tokyo Chemical Industry Co., Ltd., curing accelerator), and 0.025 parts by mass of zinc octanoate (manufactured by Nihon Kagaku Sangyo Co., Ltd., Nikka Octhix Zinc (trademark), metal content: 18%) were added and mixed. The mixture was diluted with methyl ethyl ketone to obtain resin varnish having a solid content concentration of 65 wt %.

A 0.04 mm T glass woven fabric was impregnated and coated with this resin varnish, and dried by heating at 165° C. for 5 minutes to prepare a prepreg of 0.1 mmt.

Next, 8 layers of the obtained prepreg were provided, and 12 µm thick electrolytic copper foils (3EC-III, manufactured by Mitsui Mining & Smelting Co., Ltd.) were disposed on the upper and lower faces of the obtained laminate and lamination-molded by vacuum pressing at a pressure of 30 kgf/cm$^2$ at a temperature of 230° C. for 120 minutes to prepare a metal foil-clad laminate (double-sided copper-clad laminate) having a thickness of 0.8 mm.

Results of measuring the thermal conductivity, copper foil peel strength and heat resistance upon moisture absorption of the metal foil-clad laminate of Example 1-1 are shown in Table 2.

Example 1-2

A metal foil-clad laminate and a composite sheet were prepared in the same way as in Example 1-1 except that: the amount of the boron nitride particle aggregate A added was changed to 100 parts by mass; and the amount of the zinc octanoate added was changed to 0.275 parts by mass. Their evaluation results are shown in Table 2.

Comparative Example 1-1

The preparation of a metal foil-clad laminate was attempted in the same way as in Example 1-1 except that 140 parts by mass of the boron nitride particle aggregate A were changed to 140 parts by mass of UHP-S2. However, molding was impossible due to the occurrence of voids, etc. Meanwhile, a composite sheet was prepared, and its evaluation results are shown in Table 2.

Comparative Example 1-2

A metal foil-clad laminate and a composite sheet were prepared in the same way as in Example 1-1 except that: 140 parts by mass of the boron nitride particle aggregate A were changed to 100 parts by mass of UHP-S2; and the amount of the zinc octanoate added was changed to 0.30 parts by mass. Their evaluation results are shown in Table 2.

Example 2-1

A metal foil-clad laminate and a composite sheet were prepared in the same way as in Example 1-1 except that: 140 parts by mass of the boron nitride particle aggregate A were changed to 140 parts by mass of the boron nitride particle aggregate B; and the amount of the zinc octanoate added was changed to 0.05 parts by mass. Their evaluation results are shown in Table 3.

Example 2-2

A metal foil-clad laminate and a composite sheet were prepared in the same way as in Example 2-1 except that: the amount of the boron nitride particle aggregate B added was changed to 110 parts by mass; and the amount of the zinc octanoate added was changed to 0.175 parts by mass. Their evaluation results are shown in Table 3.

Comparative Example 2-1

The preparation of a metal foil-clad laminate was attempted in the same way as in Example 2-1 except that 140 parts by mass of the boron nitride particle aggregate B were changed to 140 parts by mass of MBN-010T. However, molding was impossible due to the occurrence of voids, etc. Meanwhile, a composite sheet was prepared, and its evaluation results are shown in Table 3.

Comparative Example 2-2

A metal foil-clad laminate and a composite sheet were prepared in the same way as in Example 2-1 except that: 140 parts by mass of the boron nitride particle aggregate B were changed to 130 parts by mass of MBN-010T; the zinc octanoate was changed to 0.01 parts by mass of manganese octanoate (manufactured by Nihon Kagaku Sangyo Co., Ltd., Nikka Octhix Manganese (trademark), metal content: 8%); and the glass cloth to be coated with the resin varnish was changed to a 0.04 mm E glass woven fabric. Their evaluation results are shown in Table 3.

Comparative Example 2-3

A metal foil-clad laminate and a composite sheet were prepared in the same way as in Example 2-1 except that: 140 parts by mass of the boron nitride particle aggregate B were changed to 110 parts by mass of MBN-010T; and the amount of the zinc octanoate added was changed to 0.25 parts by mass. Their evaluation results are shown in Table 3.

TABLE 2

|  |  | Example 1-1 | Example 1-2 | Comparative Example 1-1 | Comparative Example 1-2 |
|---|---|---|---|---|---|
| Thermal conductivity (Z-axis at 25 deg. C.) | W/mk | 1.11 | 0.92 | Not moldable | 0.93 |
| Thermal conductivity (XY-axis at 25 deg. C.) | W/mk | 1.48 | 1.23 | Not moldable | 1.17 |
| Copper foil peel strength (0.8 mmt) | kgf/cm | 1.0 | 0.64 | Not moldable | 0.54 |
| Heat resistance upon moisture absorption | 1 h | — | 2 | Not moldable | 2 |
|  | 3 h | — | 1 | Not moldable | 0 |

TABLE 3

|  |  | Example 2-1 | Example 2-2 | Comparative Example 2-1 | Comparative Example 2-2 | Comparative Example 2-3 |
|---|---|---|---|---|---|---|
| Thermal conductivity (Z-axis at 25 deg. C.) | W/mk | 1.25 | 1.00 | Not moldable | 1.11 | 1.00 |
| Thermal conductivity (XY-axis at 25 deg. C.) | W/mk | 1.94 | 1.30 | Not moldable | 1.6 | 1.40 |
| Copper foil peel strength (0.8 mmt) | kgf/cm | 0.52 | 0.60 | Not moldable | 0.34 | 0.50 |
| Heat resistance upon moisture absorption | 1 h | — | 3 | Not moldable | — | 3 |
|  | 3 h | — | 3 | Not moldable | — | 2 |

INDUSTRIAL APPLICABILITY

The resin composition of the present invention has industrial applicability as a material for prepregs, metal foil-clad laminates, laminated resin sheets, resin sheets, printed circuit boards, etc.

The invention claimed is:
1. A resin composition comprising:
a cyanate compound (A) and/or a maleimide compound (B), and
an inorganic filler (C), wherein
the inorganic filler (C) consists of a boron nitride particle aggregate comprising primary hexagonal boron nitride particles, wherein (0001) planes of the primary hexagonal boron nitride particles are stacked on top of each other to thereby form the boron nitride particle aggregate.
2. The resin composition according to claim 1, wherein the boron nitride particle aggregate has a pillar shape.
3. The resin composition according to claim 1, wherein a longest diameter in a layering direction of the boron nitride particle aggregate is larger than a longest diameter in a width direction of the boron nitride particle aggregate.
4. The resin composition according to claim 1, wherein the primary hexagonal boron nitride particles have a component derived from a coupling agent.
5. The resin composition according to claim 1, wherein a content of the inorganic filler (C) is 1 to 1600 parts by mass based on 100 parts by mass of a resin solid component.
6. The resin composition according to claim 1, wherein a content of the cyanate compound (A) is 1 to 90 parts by mass based on 100 parts by mass of a resin solid component.
7. The resin composition according to claim 1, wherein a content of the maleimide compound (B) is 1 to 90 parts by mass based on 100 parts by mass of a resin solid component.
8. The resin composition according to claim 1, further comprising one or more selected from the group consisting of: a cyanate compound other than the cyanate compound (A) represented by the formula (1) and the cyanate compound (A) represented by the formula (2); an epoxy resin; an oxetane resin; a phenol resin; a benzoxazine compound; and a compound having a polymerizable unsaturated group.
9. A prepreg comprising
a base material (D), and
the resin composition according to claim 1, with which the base material (D) is impregnated or coated.
10. A metal foil-clad laminate comprising
the prepreg according to claim 9, and
a metal foil disposed on one side or both sides of the prepreg,
wherein the metal foil-clad laminate comprises a cured product of the resin composition contained in the prepreg.

11. A resin sheet comprising the resin composition according to claim 1.

12. A printed circuit board comprising
an insulating layer, and
a conductor layer formed on a surface of the insulating layer, wherein
the insulating layer comprises the resin composition according to claim 1.

* * * * *